US 10,068,881 B2

(12) United States Patent
Kwon

(10) Patent No.: US 10,068,881 B2
(45) Date of Patent: Sep. 4, 2018

(54) PACKAGE-ON-PACKAGE TYPE SEMICONDUCTOR PACKAGE AND METHOD OF FABRICATING THE SAME

(71) Applicant: SAMSUNG ELECTRONICS CO., LTD., Suwon-si, Gyeonggi-do (KR)

(72) Inventor: Heungkyu Kwon, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/392,275

(22) Filed: Dec. 28, 2016

(65) Prior Publication Data

US 2017/0194299 A1    Jul. 6, 2017

(30) Foreign Application Priority Data

Dec. 31, 2015 (KR) .................. 10-2015-0190833

(51) Int. Cl.
| | |
|---|---|
| *H01L 23/544* | (2006.01) |
| *H01L 21/00* | (2006.01) |
| *H01L 25/10* | (2006.01) |
| *H01L 25/00* | (2006.01) |

(52) U.S. Cl.
CPC .......... *H01L 25/105* (2013.01); *H01L 23/544* (2013.01); *H01L 25/50* (2013.01); *H01L 2223/54426* (2013.01); *H01L 2224/16225* (2013.01); *H01L 2224/32145* (2013.01); *H01L 2224/48091* (2013.01); *H01L 2224/73265* (2013.01); *H01L 2225/1023* (2013.01); *H01L 2225/1058* (2013.01); *H01L 2225/1082* (2013.01)

(58) Field of Classification Search
CPC ........................................................ H01L 22/34
USPC ..................... 438/462, 401, 975; 257/797
See application file for complete search history.

(56) References Cited

U.S. PATENT DOCUMENTS

| | | | |
|---|---|---|---|
| 5,644,102 A | 7/1997 | Rostoker | |
| 7,989,967 B2 | 8/2011 | Loon | |
| 8,044,526 B2 | 10/2011 | Lam | |
| 9,318,386 B2 * | 4/2016 | Hu | ........................ H01L 21/78 |
| | | | 257/797 |
| 9,666,522 B2 * | 5/2017 | Huang | ............. H01L 21/76802 |
| 9,691,706 B2 * | 6/2017 | Yu | ...................... H01L 23/5389 |
| 2014/0147971 A1 | 5/2014 | Yokosawa | |

(Continued)

FOREIGN PATENT DOCUMENTS

| | | |
|---|---|---|
| JP | 2006-156674 A | 6/2006 |
| KR | 2000-0020573 A | 4/2000 |

(Continued)

*Primary Examiner* — Calvin Lee
(74) *Attorney, Agent, or Firm* — Lee & Morse, P.C.

(57) ABSTRACT

Provided are a package-on-package type semiconductor package and a method of fabricating the same. The semiconductor package includes upper package stacked on a lower package and a via provided between the lower and upper packages to electrically connect the lower and upper packages to each other. The lower package includes a lower package substrate, a lower semiconductor chip mounted on the lower package substrate, and a lower mold layer encapsulating the lower semiconductor chip and including an alignment mark. The lower mold layer includes a marking region, which is provided between the via and the lower semiconductor chip, and on which the alignment mark is provided.

19 Claims, 16 Drawing Sheets

(56) References Cited

U.S. PATENT DOCUMENTS

2014/0175657 A1 6/2014 Oka et al.
2014/0374922 A1 12/2014 Huang et al.
2016/0099205 A1 4/2016 Kwon et al.

FOREIGN PATENT DOCUMENTS

| KR | 2000-0058979 A | 10/2000 |
| KR | 10-2011-0042943 A | 4/2011 |
| KR | 10-2012-0018804 A | 3/2012 |
| KR | 10-2014-0116560 A | 10/2014 |
| KR | 10-2015-0082164 A | 7/2015 |
| KR | 10-2015-0101914 A | 9/2015 |

* cited by examiner

PACKAGE-ON-PACKAGE TYPE SEMICONDUCTOR PACKAGE AND METHOD OF FABRICATING THE SAME

CROSS-REFERENCE TO RELATED APPLICATION

Korean Patent Application No. 10-2015-0190833, filed on Dec. 31, 2015, in the Korean Intellectual Property Office, and entitled: "Package-On-Package Type Semiconductor Package and Method of Fabricating the Same," is incorporated by reference herein in its entirety.

BACKGROUND

1. Field

The present disclosure relates to a semiconductor device, and in particular, to a package-on-package type semiconductor package and a method of fabricating the same.

2. Description of the Related Art

A laser marking process for making an alignment mark on a semiconductor package is generally performed on a mold layer covering a semiconductor chip. The use of the laser may lead to damage of the semiconductor chip. Such damage of the semiconductor chip can be prevented by lowering an intensity of a laser beam in the laser marking process, but this approach may lead to reduced visibility of the mark and a yield reduction in a package stacking process.

SUMMARY

According to some embodiments, a semiconductor package may include an upper package stacked on a lower package and a via provided between the lower and upper packages to electrically connect the lower and upper packages to each other. The lower package may include a lower package substrate, a lower semiconductor chip mounted on the lower package substrate, and a lower mold layer encapsulating the lower semiconductor chip and including an alignment mark. The lower mold layer may include a marking region, which is provided between the via and the lower semiconductor chip, and on which the alignment mark is provided.

According to some embodiments, a semiconductor package may include a lower package including at least one lower semiconductor chip mounted on a lower package substrate and encapsulated with a lower mold layer, an upper package including at least one upper semiconductor chip mounted on an upper package substrate and encapsulated with an upper mold layer, and a via electrically connecting the lower package to the upper package. The lower mold layer may include a marking region provided between the via and the lower semiconductor chip. Here, the marking region may include a rotational alignment mark configured to allow the lower and upper packages to have the same orientation, and a vertical alignment mark configured to allow centers of the lower and upper packages to be aligned with each other.

According to some embodiments, a semiconductor package may include a lower package including a lower semiconductor chip, which is mounted on a lower package substrate, and a lower mold layer, which is provided to encapsulate the lower semiconductor chip, and an upper package, which is vertically stacked on the lower package and is electrically connected to the lower package through a plurality of vias vertically passing through the lower mold layer. The lower mold layer may include a top surface facing the upper package and having at least one recognition mark, the recognition mark may be provided on a portion of the lower mold layer, and the portion of the lower mold layer may be provided between the lower semiconductor chip and the via to cover a side surface of the lower semiconductor chip.

According to some embodiments, a method of fabricating a semiconductor package may include providing a lower package, providing an upper package on the lower package, and electrically connecting the lower package to the upper package. The providing of the lower package may include providing a lower semiconductor chip and a lower terminal spaced apart from the lower semiconductor chip, on a lower package substrate, providing a lower mold layer encapsulating the lower semiconductor chip and the lower terminal, on the lower package substrate, irradiating a first laser onto the lower mold layer to form a via hole exposing the lower terminal, and irradiating a second laser onto the lower mold layer to form a laser mark. The laser mark may be formed on a laser marking region, which is a portion of the lower mold layer positioned between the via hole and the lower semiconductor chip.

According to some embodiments, a method of fabricating a semiconductor package may include providing a lower package, providing an upper package on the lower package, and electrically connecting the lower and upper packages to each other. The providing of the lower package may include providing a lower semiconductor chip and a lower terminal spaced apart from the lower semiconductor chip, on a lower package substrate, providing a lower mold layer on the lower package substrate to encapsulate the lower semiconductor chip and the lower terminal, removing a portion of the lower mold layer to form a via hole exposing the lower terminal, and removing other portion of the lower mold layer to form a recognition mark between the lower semiconductor chip and the via hole. The via hole and the recognition mark may be formed in situ in a single process.

According to some embodiments, a method of fabricating a semiconductor package may include providing a lower package, providing an upper package on the lower package, and electrically connecting the lower package to the upper package. The providing of the lower package may include providing a lower semiconductor chip and a lower terminal, which are spaced apart from the lower semiconductor chip, on a lower package substrate, providing a lower mold layer on the lower package substrate to encapsulate the lower semiconductor chip and the lower terminal, irradiating a laser onto a first portion of the lower mold layer covering the lower terminal to form a via hole exposing the lower terminal, and irradiating the laser onto a second portion of the lower mold layer between the lower terminal and the lower semiconductor chip to form a recognition mark. The via hole and the recognition mark may be formed by a single process, which is performed using the same laser in the same equipment.

According to some embodiments, a semiconductor package may include an upper package stacked on a lower package, and a via between the lower and upper packages to electrically connect the lower and upper packages to each other, wherein the lower package includes a lower semiconductor chip on a lower package substrate, and a lower mold layer encapsulating the lower semiconductor chip, the lower mold layer having an alignment mark between the via and a lateral surface of the lower semiconductor chip, the alignment mark being horizontally spaced apart from each of the via and the lateral surface of the lower semiconductor chip.

BRIEF DESCRIPTION OF THE DRAWINGS

Features will become apparent to those of ordinary skill in the art by describing in detail exemplary embodiments with reference to the attached drawings, in which.

DETAILED DESCRIPTION

[Method Of Fabricating Semiconductor Package]

FIGS. 1A, 2A, 3A, 4A, 5A, and 6A are sectional views illustrating stages in a method of fabricating a semiconductor package, according to some embodiments. FIGS. 1B, 2B, 3B, 4B, 5B, and 6B are top plan views illustrating a semiconductor package at fabrication stages, which are illustrated by FIGS. 1A, 2A, 3A, 4A, 5A, and 6A, respectively. FIGS. 3C and 3D are enlarged sectional views of a portion of FIG. 3A. FIGS. 3E and 3F are plan views illustrating other examples of FIG. 3B.

Figure 1A:
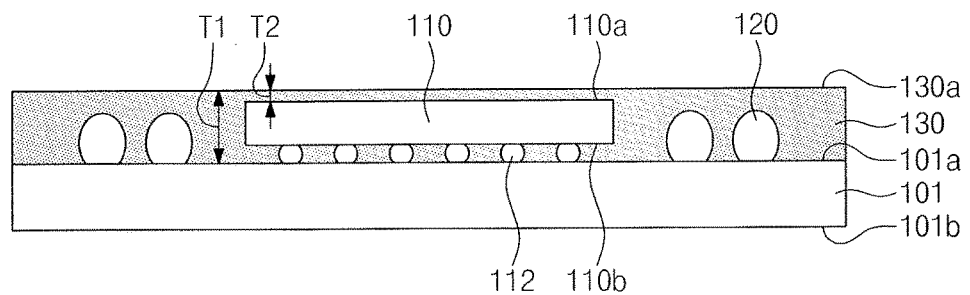
FIGS. 1A, 2A, 3A, 4A, 5A, and 6A illustrate sectional views of stages in a method of fabricating a semiconductor package, according to some embodiments.
Figure 1B:
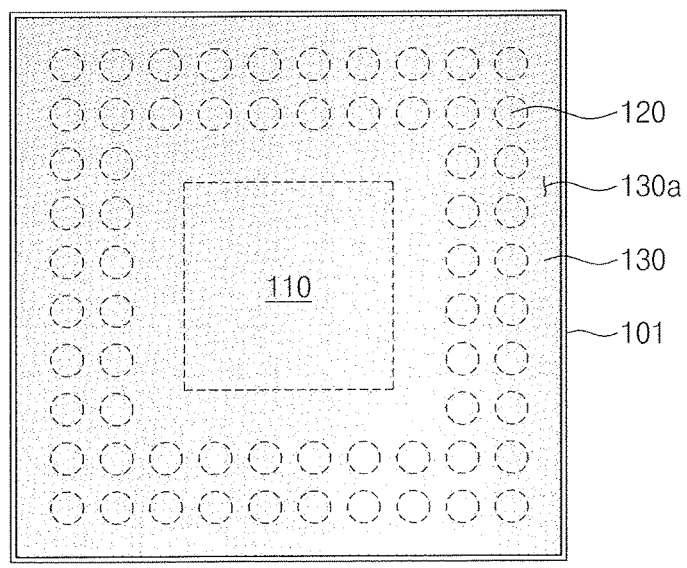
FIGS. 1B, 2B, 3B, 4B, 5B, and 6B illustrate top plan views of a semiconductor package at fabrication stages corresponding to FIGS. 1A, 2A, 3A, 4A, 5A, and 6A, respectively.

Referring to FIGS. 1A and 1B, a lower package substrate 101 with a top surface 101a and a bottom surface 101b may be provided. The lower package substrate 101 may be, e.g., a printed circuit board (PCB). A lower semiconductor chip 110 may be mounted on the top surface 101a of the lower package substrate 101, e.g., in a flip-chip bonding manner, and a lower mold layer 130 may be formed to encapsulate the lower semiconductor chip 110. For example, the lower mold layer 130 may be formed by a mold underfill (MUF) process of forming an epoxy molding compound (EMC) on the lower package substrate 101. The lower mold layer 130 may serve as a molding structure encapsulating the lower semiconductor chip 110 and may also serve as underfiller filling a gap region between the lower package substrate 101 and the lower semiconductor chip 110.

The lower mold layer 130 may have a first thickness T1 that is thick enough to allow the lower mold layer 130 to cover a top surface 110a of the lower semiconductor chip 110. In other words, a top surface 130a of the lower mold layer 130 may be higher than the top surface 110a of the lower semiconductor chip 110 relative to the top surface 101a of the lower package substrate 101. In some embodiments, the top surface 110a of the lower semiconductor chip 110 may be used as an inactive surface, and a bottom surface 110b opposite thereto may be used as an active surface. In certain embodiments, the top surface 110a of the lower semiconductor chip 110 may be used as the active surface, and the bottom surface 110b may be used as the inactive surface. Between the top surface 110a of the lower semiconductor chip 110 and the top surface 130a of the lower mold layer 130, the lower mold layer 130 may have a second thickness T2 that is thinner than the first thickness T1. The lower semiconductor chip 110 may be electrically connected to the lower package substrate 101 via a plurality of connection terminals 112 (e.g., solder bumps). The lower semiconductor chip 110 may be one of, e.g., a memory chip, a logic chip, or any combination thereof. For example, the lower semiconductor chip 110 may be a system-on-chip (SOC).

A plurality of lower terminals 120 (e.g., solder balls) may be further formed on the top surface 101a of the lower package substrate 101. The lower terminals 120 may be fully covered with the lower mold layer 130, and thus, they may not be exposed to the outside. For example, the lower terminals 120 may have a thickness, e.g., height, that is substantially equal to or smaller than the first thickness T1 of the lower mold layer 130. In some embodiments, as shown in FIG. 1B, the lower terminals 120 may be formed on an edge region, e.g., along a periphery, of the top surface 101a of the lower package substrate 101 to laterally enclose, e.g., surround a perimeter of, the lower semiconductor chip 110, which is provided on a center region of the top surface 101a of the lower package substrate 101, or to have a ring-shaped arrangement. In certain embodiments, the lower terminals 120 may be arranged to be parallel to at least one of side surfaces of the lower semiconductor chip 110 or to form at least one column.

Figure 2A:
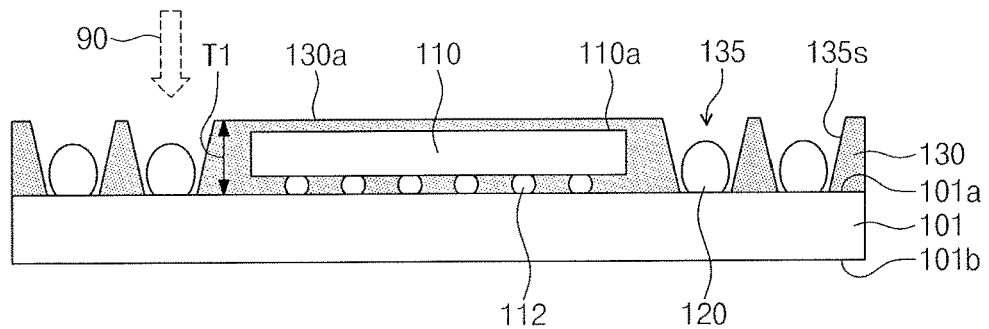
Figure 2B:
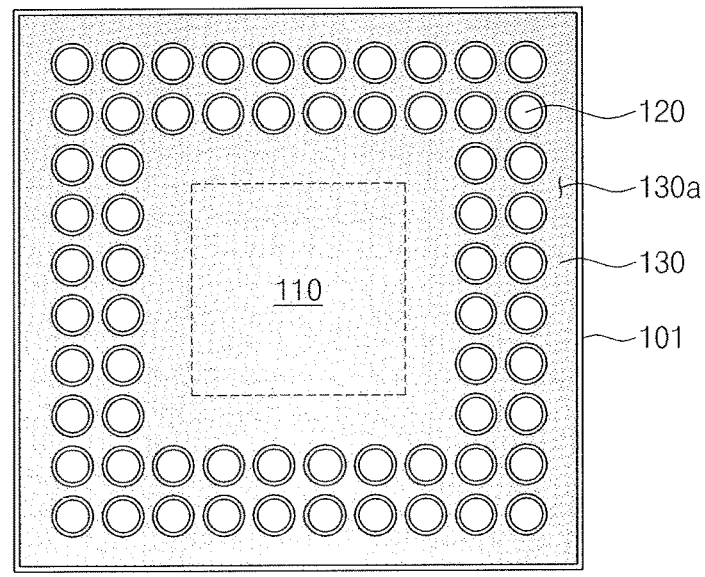

Referring to FIGS. 2A and 2B, the lower mold layer 130 may be patterned to form a plurality of via holes 135 exposing the lower terminals 120, e.g., each via hole 135 may expose a corresponding lower terminal 120. The via holes 135 may be formed to have a depth corresponding, e.g., equal, to the first thickness T1 of the lower mold layer 130. In some embodiments, as shown in FIG. 2B, the formation of the via holes 135 may include pattering the lower mold layer 130, e.g., by a drilling process using a first laser 90, to form openings of a circular or similar shape, when viewed in a plan view. Arrangement of the via holes 135 may be dependent on that of the lower terminals 120. For example, the via holes 135 may be formed to have a ring-shaped arrangement laterally enclosing the lower semiconductor chip 110. In certain embodiments, the via holes 135 may be arranged to be parallel to at least one of side surfaces of the lower semiconductor chip 110 or to form at least one column.

The via hole 135 may be formed to have a size or diameter that is large enough to completely expose the lower terminal 120, and an inner side surface 135s of the via hole 135 may not be in contact with the lower terminal 120. The inner side surface 135s of the via hole 135 may have a downward slope in a direction from the top surface 130a of the lower mold layer 130 toward the top surface 101a of the lower package substrate 101. For example, when viewed in a sectional view, the via hole 135 may have a decreasing horizontal width or a downward tapering structure, in a direction approaching toward the top surface 101a of the lower package substrate 101. In certain embodiments, unlike FIG. 2A, the inner side surface 135s of the via hole 135 may be perpendicular to the top surface 101a of the lower package substrate 101.

Figure 3A:
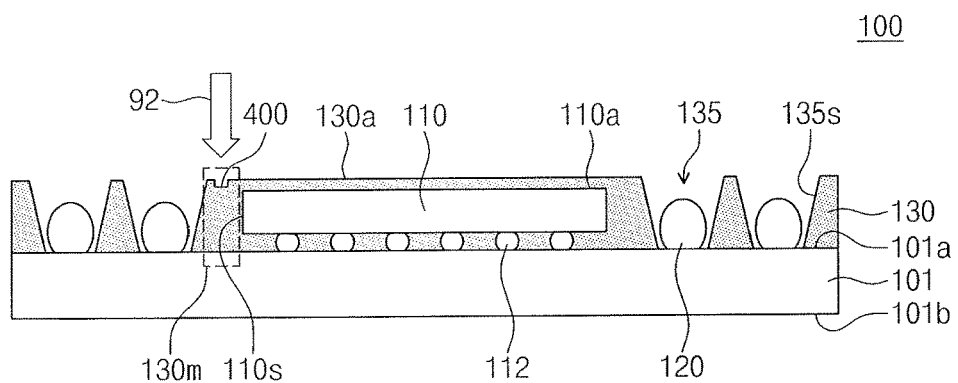
Figure 3B:
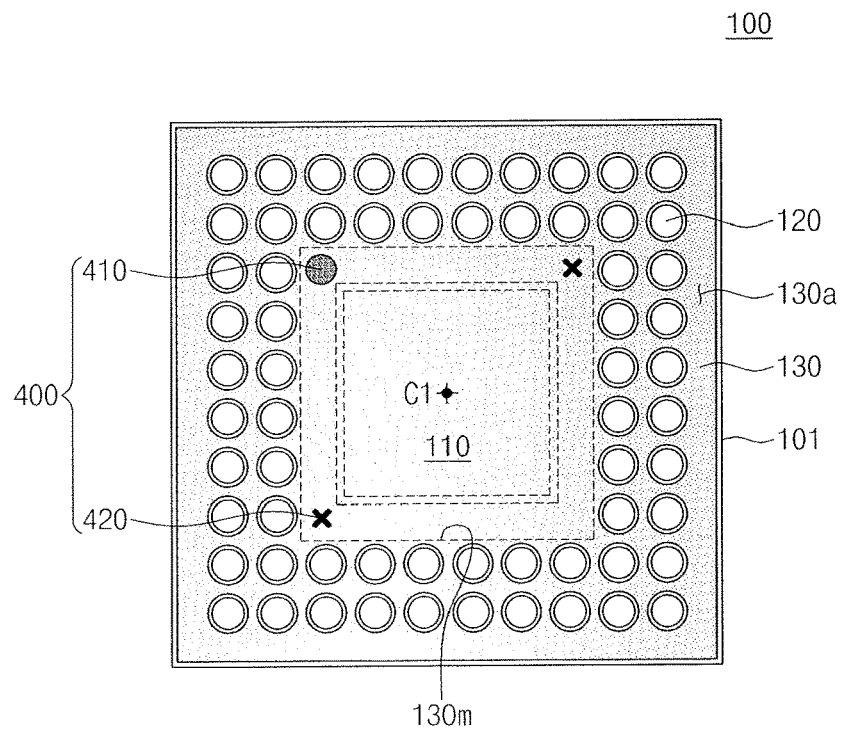
Figure 3C:
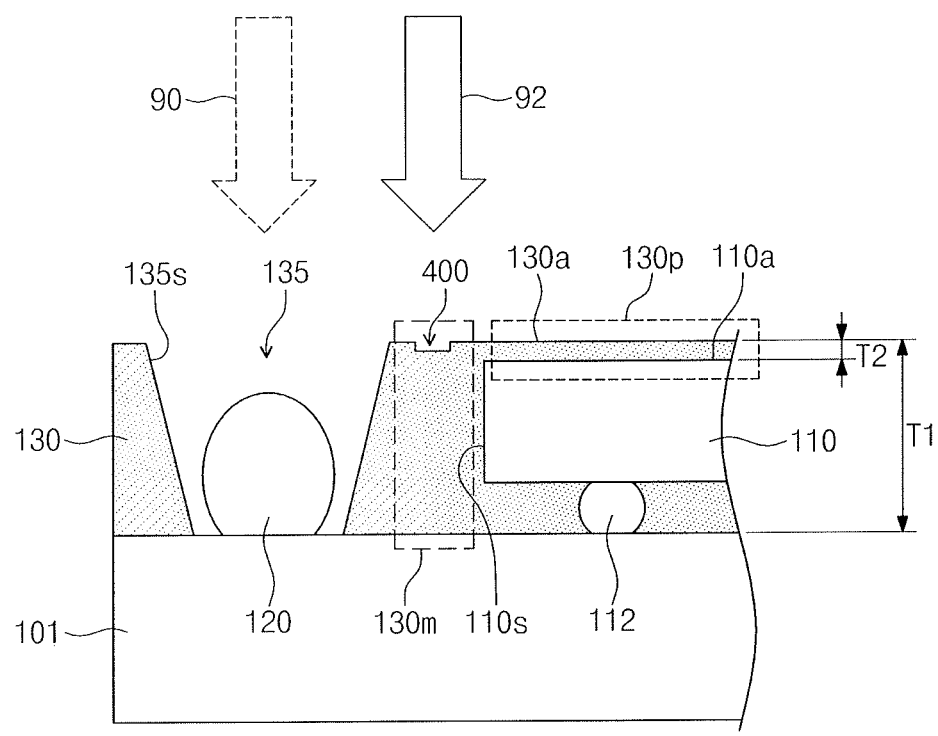
FIGS. 3C and 3D illustrate enlarged sectional views of a portion of FIG. 3A.
Figure 3D:
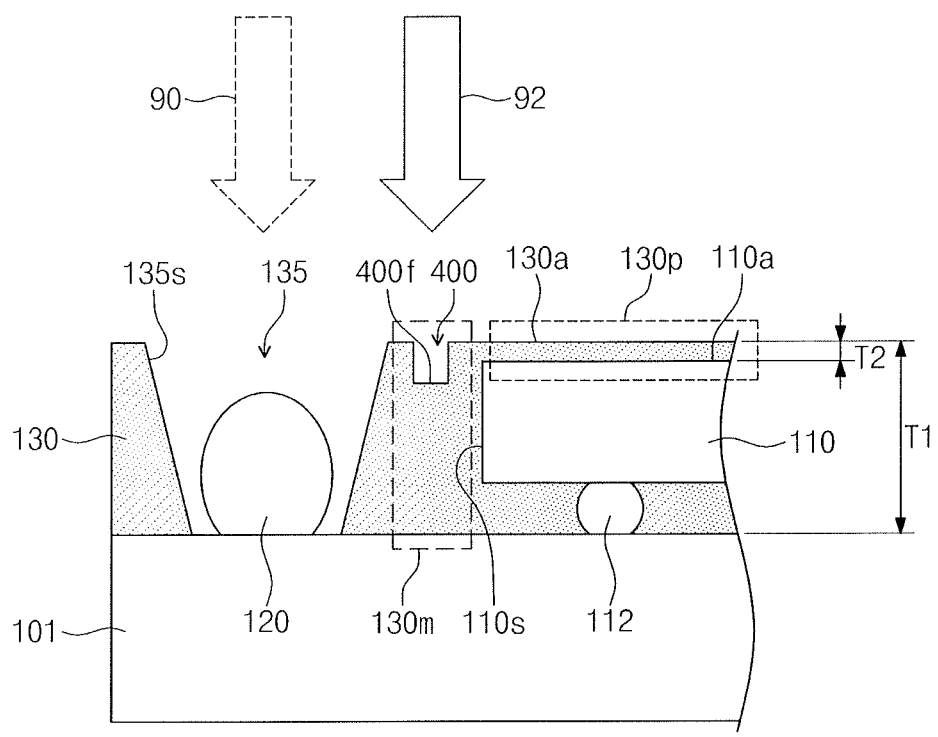
Figure 3E:
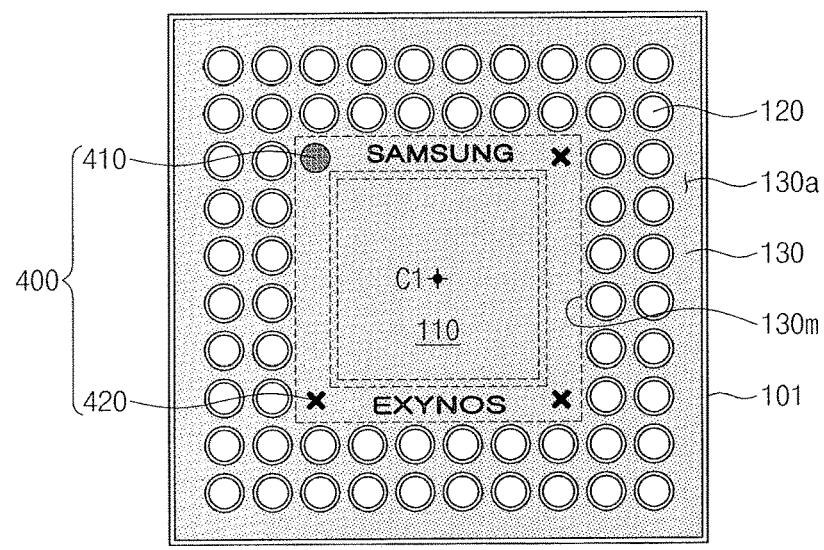
FIGS. 3E and 3F illustrate plan views of other examples of FIG. 3B.
Figure 3F:
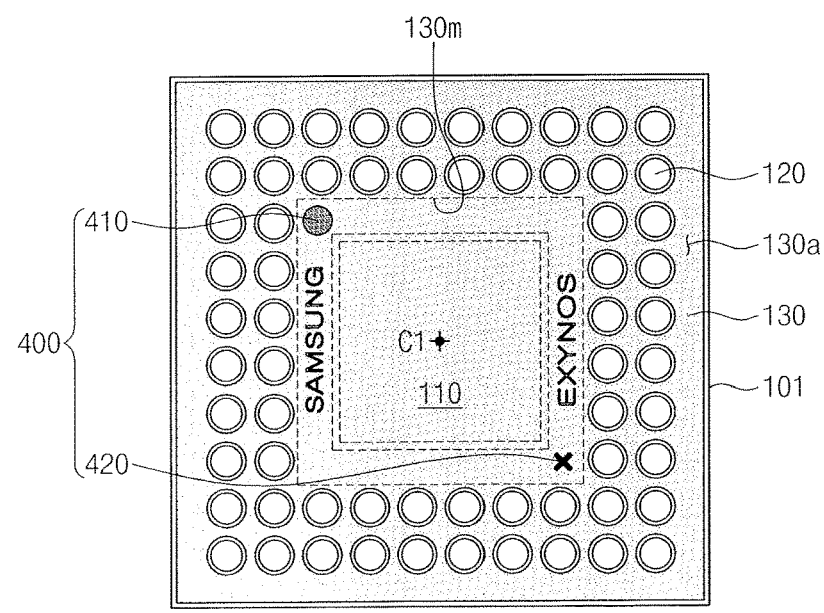

Referring to FIGS. 3A and 3B, a mark 400 may be formed, e.g., directly, on a marking region 130m that is a part of the lower mold layer 130, using a second laser 92. As a result, a lower package 100 may include the lower package substrate 101, the lower semiconductor chip 110 mounted on the lower package substrate 101, and the lower mold layer 130 covering the lower semiconductor chip 110 and having the mark 400.

In detail, the marking region 130m may be provided between the via hole 135 adjacent to the lower semiconductor chip 110 and a side surface 110s of the lower semiconductor chip 110. For example, as illustrated in FIG. 3A, the marking region 130m may be defined in a portion of the lower mold layer 130 between an outermost side surface 110s of the lower semiconductor chip 110 and a via hole 135 most adjacent to the lower semiconductor chip 110. For example, the marking region 130m may be in a portion of the lower mold layer 130 that does not overlap the top surface 110a of the lower semiconductor chip 110. The marking region 130m may be provided along at least one of side surfaces 110s of the lower semiconductor chip 110. For example, when viewed in a plan view (FIG. 3B), the marking region 130m may be provided, e.g., continuously, to enclose, e.g., completely surround, the side surfaces 110s of the lower semiconductor chip 110 or have a ring shape, e.g., the marking region 130m may be defined between the two outermost dashed frames in FIG. 3B surrounding the lower semiconductor chip 110.

As shown in FIG. 3C, a portion 130p of the lower mold layer 130 provided on the top surface 110a of the lower semiconductor chip 110 may have the second thickness T2 that is smaller than the first thickness T1. Therefore, if the second laser 92 were to be irradiated toward the portion 130p of the lower mold layer 130 that overlaps the lower semiconductor chip 110 during a laser marking process, the second laser 92 could have passed through the portion 130p of the lower mold layer 130 due to its small thickness (i.e., the small thickness of the second thickness T2), thereby damaging the lower semiconductor chip 110 underneath the portion 130p. If intensity or energy of the second laser 92 were to be lowered, e.g., to be smaller than that of the first laser 90, the resultant mark could have had reduced visibility, thereby causing low accuracy in a subsequent alignment process.

Therefore, according to embodiments, a portion of the lower mold layer 130 located outside the lower semiconductor chip 110 is chosen as the marking region 130m, thereby allowing the marking region 130m to have a thickness (i.e., the first thickness T1) greater than the second thickness T2. Due to the large thickness (i.e., the first thickness T1) of the marking region 130m, it is possible to provide a sufficiently visible mark 400 on the lower mold layer 130 without damaging the lower semiconductor chip 110, i.e., to suppress or prevent a process failure from occurring in the laser marking process. For example, as shown in FIG. 3D, the laser marking process using the second laser 92 may be performed in the marking region 130m to form the mark 400 with a bottom surface 400f that is lower than the top surface 110a of the lower semiconductor chip 110. Even in this case, it is possible to prevent the lower semiconductor chip 110 from being damaged. In addition, it is possible to allow the mark 400 to have a larger depth (i.e., to further lower a vertical level of the bottom surface 400o and consequently to improve visibility of the mark 400.

According to some embodiments, portions of the lower mold layer 130 for the via hole 135 and the mark 400 may have substantially the same thickness (i.e., the first thickness T1), and both of the via hole 135 and the mark 400 may be formed using a laser having same intensity or energy. For example, the first and second lasers 90 and 92, which are used to form the via hole 135 and the mark 400, respectively, may have the same energy and/or may be generated from the same laser source. However, in certain embodiments, the second laser 92 may have a lower energy than the first laser 90.

The via hole 135 and the mark 400, which are formed using the first and second lasers 90 and 92, respectively, may he formed in the same equipment and during the same process. For example, the via hole 135 may be formed using the first laser 90, and then, the mark 400 may be formed in situ (i.e., in the same equipment) using the second laser 92 generated from the same laser source as that for the first laser 90. In certain embodiments, the via hole 135 and the mark 400 may be formed in a substantially simultaneous manner using the same laser beam. In certain embodiments, the mark 400 may be formed, and then, the via hole 135 may be formed in the same equipment as that for the mark 400. There may be a difference in irradiation times of the first and second lasers 90 and 92. For example, the irradiation time of the second laser 92 may be shorter than that of the first laser 90.

The mark 400 may include at least one of a first mark 410 and a second mark 420, as shown in FIG. 3B. The first mark 410 may have various shapes (e.g., a circle, a cross, a saltire, a letter "L", a polygon, and so forth). The second mark 420 may also have various shapes (e.g., a circle, a cross, a saltire, a letter "L", a polygon, and so forth) but may be different from that of the first mark 410. In certain embodiments, the first mark 410 and the second mark 420 may have the same shape, but different sizes. For example, the first mark 410 may be a large circle, and the second mark 420 may be a small circle. In some embodiments, the mark 400 may include at least one first mark 410 and at least two second marks 420, as shown in FIG. 3B, but embodiments are not limited thereto.

The mark 400 may be formed to be adjacent to a corner or a side surface of the lower semiconductor chip 110. When viewed in a plan view, the first mark 410 may be formed to be adjacent to an upper-left corner of the lower semiconductor chip 110. The second marks 420 may be formed to be adjacent to two opposite corners of the lower semiconductor chip 110. For example, the second marks 420 may be formed to be adjacent to lower-left and upper-right corners of the lower semiconductor chip 110. As an example, the second marks 420 may be located on a diagonal line passing through the lower-left and upper-right corners of the lower semiconductor chip 110.

The second marks 420 may be used to define a center point C1 of the lower package 100 and may be used for a vertical alignment between the lower package 100 and a semiconductor device stacked thereon. The first mark 410 may be used for a rotational alignment of the semiconductor device with respect to the lower package 100. The vertical and rotational alignments will be described with reference to FIGS. 5A and 5B.

As another example, three second marks 420 may be formed to be adjacent to three corners of the lower semiconductor chip 110, as shown in FIG. 3E. Optionally, when the mark 400 is formed, product information of the lower package 100 may be marked (e.g., in the form of letters or figures) on the lower mold layer 130. As an example, a manufacturer's name (e.g., "SAMSUNG") and/or a product model name (e.g., "EXYNOS") may be additionally formed on the marking region 130m.

As another example, the mark 400 may include the first mark 410 and the second mark 420 that are formed to be adjacent to two opposite diagonal corners of the lower semiconductor chip 110, as shown in FIG. 3F. The first mark 410 and the second mark 420 may be located on a diagonal line passing through the two opposite diagonal corners of the lower semiconductor chip 110. The first mark 410 may be used for the rotational alignment of the semiconductor device with respect to the lower package 100, and the second mark 420, along with the first mark 410, may be used to define the center point C1 of the lower package 100.

Figure 4A:
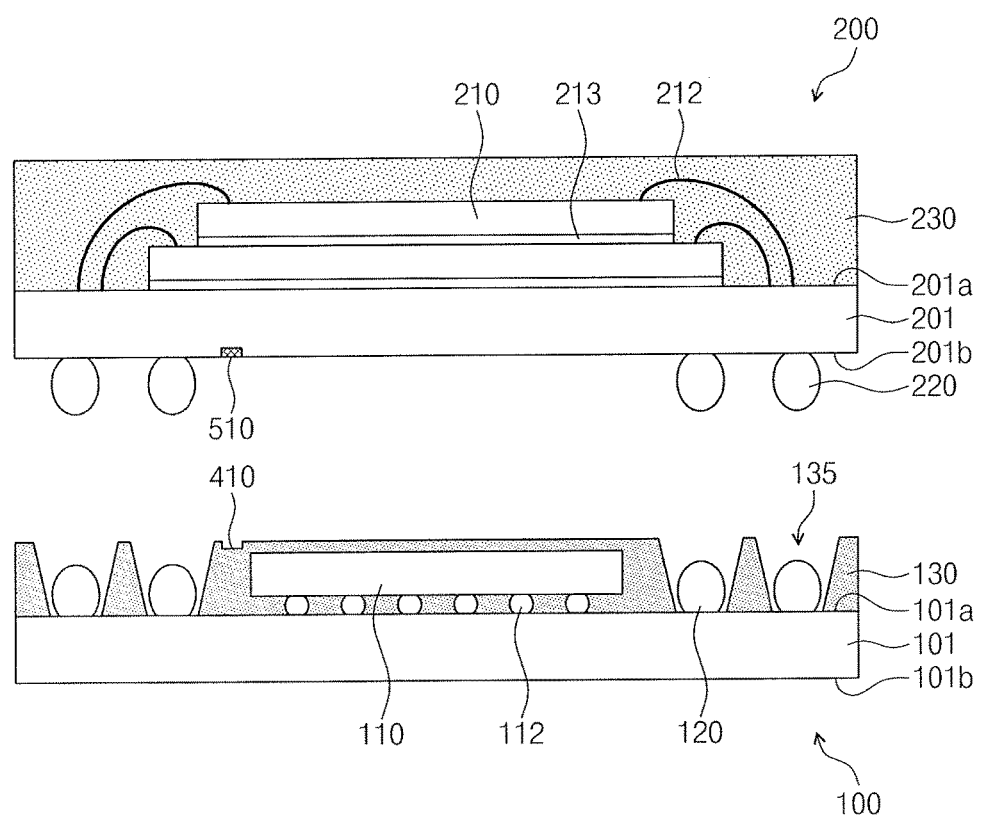
Figure 4B:
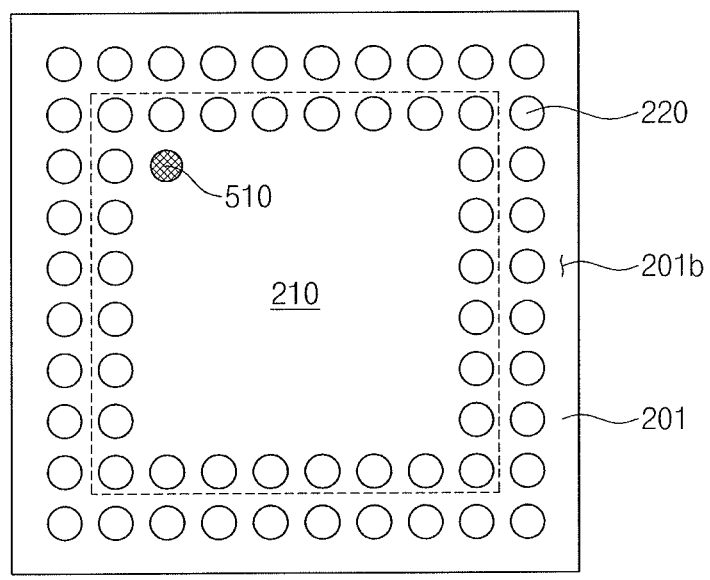

Referring to FIGS. 4A and 4B, an upper package 200 may be provided. The upper package 200 may include an upper package substrate 201 with a top surface 201a and a bottom surface 201b, one or more upper semiconductor chips 210, which are mounted on the top surface 201a of the upper package substrate 201, an upper mold layer 230, which is provided to encapsulate the upper semiconductor chips 210, and a plurality of upper terminals 220, which are attached to the bottom surface 201b of the upper package substrate 201.

The upper package substrate 201 may be, e.g., a printed circuit board (PCB). The upper mold layer 230 may include, e.g., an epoxy molding compound. The upper terminals 220 may include, e.g., solder balls. The upper semiconductor chips 210 may be electrically connected to the upper package substrate 201 through, e.g., a plurality of bonding wires 212. The upper semiconductor chips 210 may be one of, e.g., a memory chip, a logic chip, or any combination thereof. As an example, the upper semiconductor chips 210 may be memory chips. The upper semiconductor chips 210 may be attached to each other and to the upper package substrate 201 by an insulating adhesive layer 213. The upper terminals 220 may be connected to the lower terminals 120 in a one-to-one manner, when the upper package 200 is stacked on the lower package 100.

The upper terminals 220 may be formed to have a same or similar arrangement as that of the lower terminals 120. For example, as shown in FIG. 4B, the upper terminals 220 may be formed on an edge region of the bottom surface 201b of the upper package substrate 201 to have a ring-shaped arrangement. The bottom surface 201b of the upper package substrate 201 may be formed to have or define an alignment mark 510. The alignment mark 510 may be formed to allow for an accurate vertical alignment between the upper package 200 and the lower package 100. For example. the alignment mark 510 may be provided to allow a vertical alignment between the first and alignment marks 410 and 510 to ensure the vertical alignment between the lower and upper packages 100 and 200.

Figure 5A:
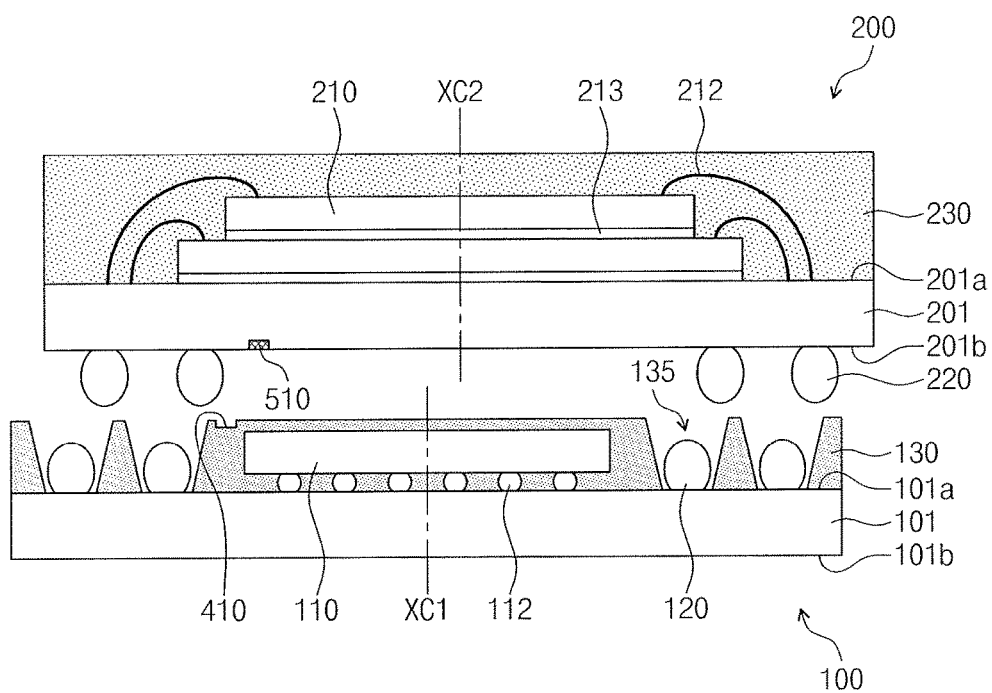
Figure 5B:
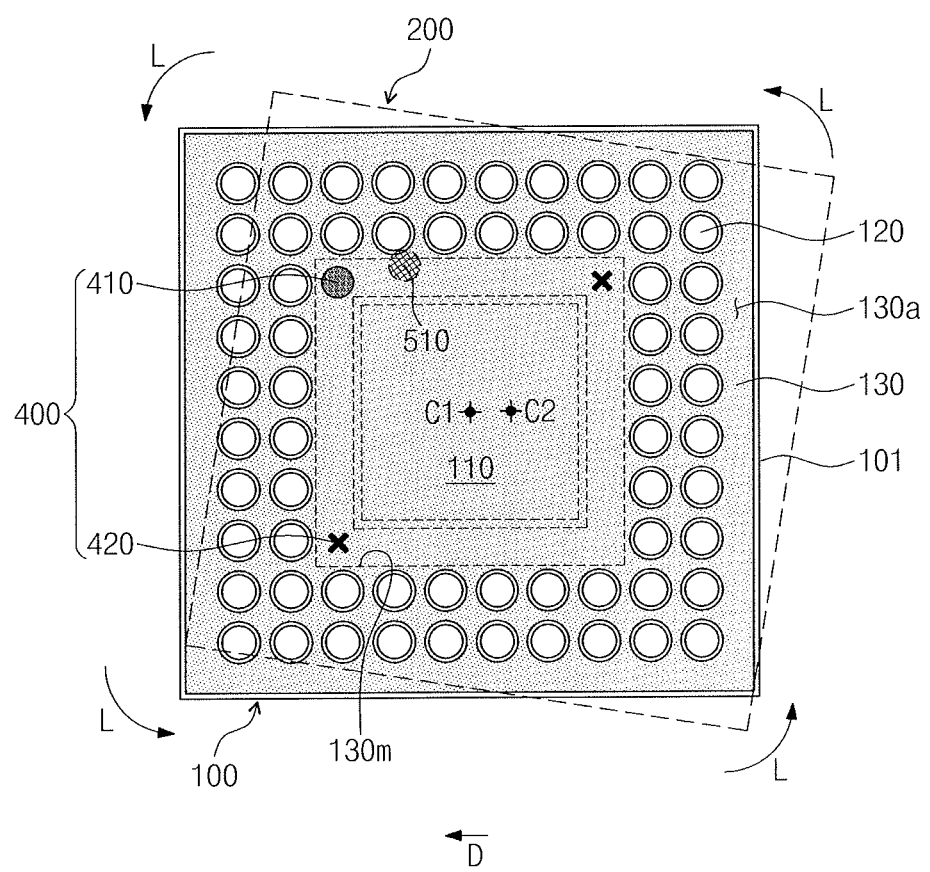

Referring to FIGS. 5A and 5B, the upper package 200 may be stacked on the lower package 100. For example, the upper package 200 may be stacked on the lower package 100 in such a way that a lower imaginary line XC1 vertically passing through the center point C1 of the lower package 100 coincides with an upper imaginary line XC2 vertically passing through a center point C2 of the upper package 200 and that the alignment mark 510 is vertically aligned with the first mark 410.

In the case where the upper package 200 is not vertically aligned with the lower package 100, it may be necessary to change a horizontal position of one of the lower and upper packages 100 and 200 with respect to the other. For example, when the upper package 200 is disposed on the lower package 100, the lower imaginary line XC1 may not coincide with the upper imaginary line XC2 and/or the first mark 410 may not be aligned with the alignment mark 510. In this case, to coincide the center points C1 and C2 of the lower and upper packages 100 and 200 with each other, the upper package 200 may be moved along a translational path (as depicted by D in FIG. 5B). If the center points C1 and C2 of the lower and upper packages 100 and 200 coincide with each other, the upper package 200 may be rotated about the upper imaginary line XC2 (as depicted by L) to coincide the first mark 410 with the alignment mark 510. Thus, it is possible to realize a proper vertical alignment between the lower terminals 120 and the upper terminals 220, to prevent a stacking failure from occurring between the lower and upper packages 100 and 200, and consequently to improve yield of the stacking process. In certain embodiments. the translational and rotational movements (e.g., D and L) of the upper package 200 may be simultaneously performed to align the upper package 200 with the lower package 100.

Figure 6A:
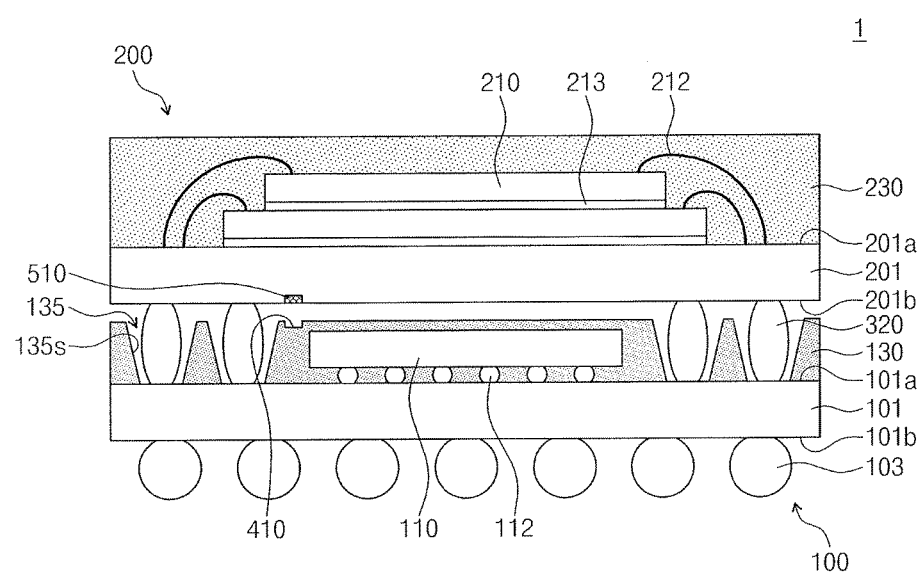
Figure 6B:
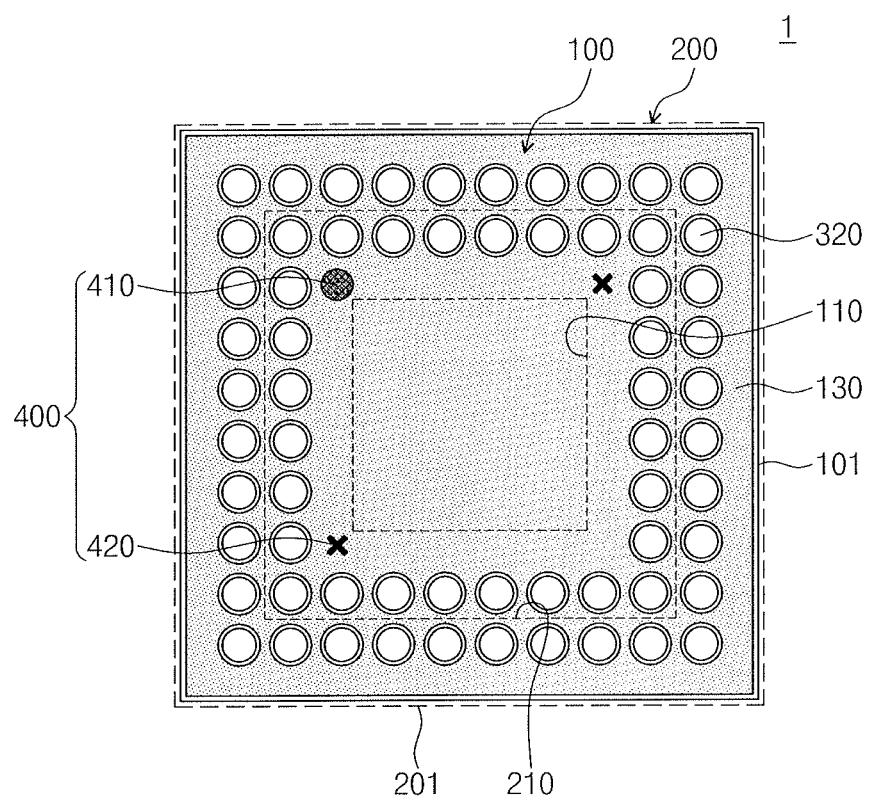

Referring to FIGS. 6A and 6B, a reflow process may be performed on the resulting structure, in which the upper package 200 is stacked on the lower package 100, to form a plurality of vias 320 electrically connecting the lower package 100 to the upper package 200. For example, the upper terminals 220 may be disposed to be in contact with the lower terminals 120, and then, the reflow process may be performed to form the vias 320, each of which includes one of the upper terminals 220 and one of the lower terminals 120 connected to each other.

In some embodiments, an empty space may be formed between the inner side surface 135s of the via hole 135 and the via 320. The formation of the empty space may allow gas or fume to be easily exhausted from the lower and upper terminals 120 and 220 of FIG. 5A, during the reflow process. Outer terminals 103 (e.g., solder balls) may be further attached to the bottom surface 101b of the lower package substrate 101.

As a result of the above processes, it is possible to fabricate a package-on-package type semiconductor package 1, in which the lower and upper packages 100 and 200 electrically connected to each other by the vias 320 are provided. According to some embodiments, the lower mold layer 130 may be formed to cover most of the top surface 101a of the lower package substrate 101, thereby suppressing or preventing warpage of the lower package 100. The semiconductor package 1 may be used as a part of various electronic products including portable products (e.g., a mobile phone) or wearable products (e.g., a smart watch).

[Other Examples Of Semiconductor Package]

FIGS. 7A to 7H are sectional views illustrating other examples of FIG. 6A.

Figure 7A:
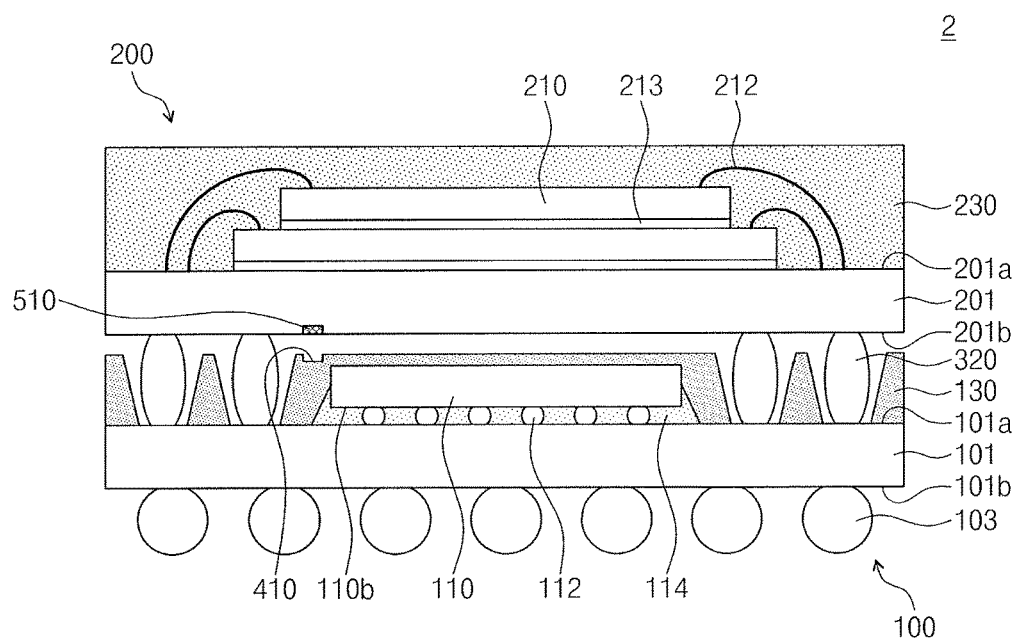
FIGS. 7A to 7H illustrate sectional views of other examples of FIG. 6A.

Referring to FIG. 7A, a semiconductor package 2 may further include an under-fill layer 114. As an example, the lower semiconductor chip 110 may be mounted on the lower package substrate 101, and then, an insulating material (e.g., a thermal compression non-conductive paste (TCNCP) or a thermal compression non-conductive film (TCNCF)) may be provided to form the under-fill layer 114, before forming the lower mold layer 130. The under-fill layer 114 may be provided to fill a gap between the lower semiconductor chip 110 and the lower package substrate 101 and may protect the lower package 100 against damage caused by harmful external environment (e.g., thermal stress).

Figure 7B:
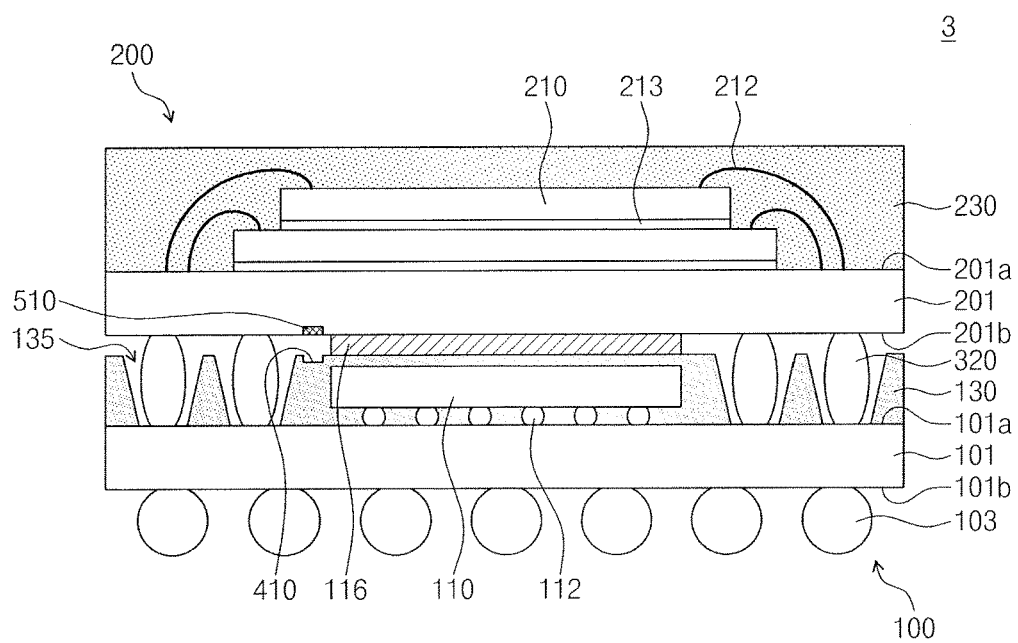

Referring to FIG. 7B, a semiconductor package 3 may further include a heat transfer layer 116 provided between the lower package 100 and the upper package 200. The heat transfer layer 116 may be provided between the lower mold layer 130 and the upper package substrate 201 and may be used to improve heat dissipation characteristics of the semiconductor package 3. The heat transfer layer 116 may include a thermal interface material (TIM). In some embodiments, a size or shape of the heat transfer layer 116 may be variously changed, unless the heat transfer layer 116 covers the first mark 410 and/or the second mark 420 (e.g., see FIG. 6B).

Figure 7C:
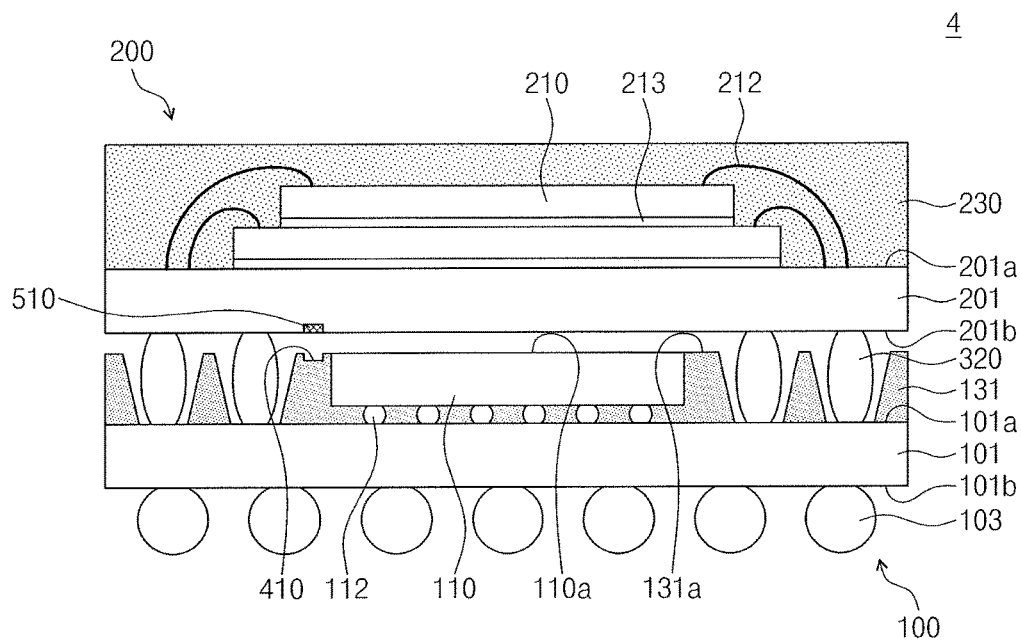

Referring to FIG. 7C, a semiconductor package 4 may include a lower mold layer 131 that is formed to expose the top surface 110a of the lower semiconductor chip 110. As an example, the formation of the lower mold layer 131 may include providing a mold material on the lower package substrate 101 not to cover the top surface 110a of the lower semiconductor chip 110. As another example, the formation of the lower mold layer 131 may include forming the lower mold layer 130 to cover the top surface 110a of the lower semiconductor chip 110, as shown in FIG. 1A, and grinding the lower mold layer 130 to expose the top surface 110a of the lower semiconductor chip 110. The top surface 110a of the lower semiconductor chip 110 may be coplanar with a top surface 131a of the lower mold layer 131. According to the present embodiment, it is possible to suppress the gap from being formed between the lower package 100 and the upper package 200 and thereby to reduce a total thickness of the semiconductor package 4. Further, as illustrated in FIG. 7C, the first mark 410 may be formed in the top surface 131a of the lower mold layer 131 in the marking region 130m (in FIG. 3B), i.e., a region not overlapping a top surface of the lower semiconductor chip 110.

Figure 7D:
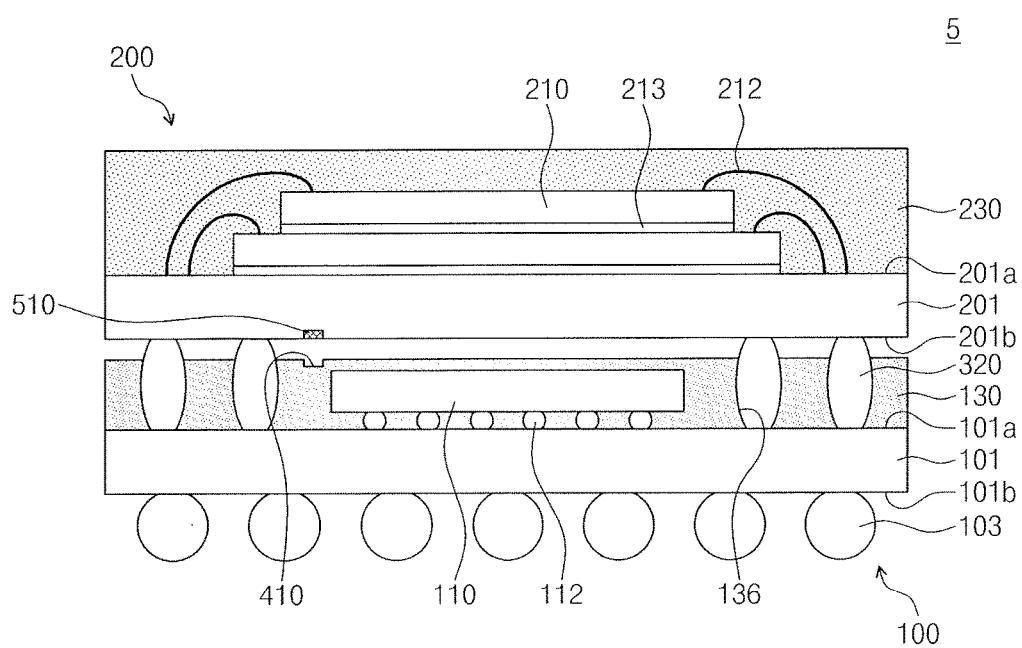

Referring to FIG. 7D, a via hole 136 of a semiconductor package 5 may be filled with the via 320, without any gap therebetween. For example, the via hole 136 may be formed by partially exposing an upper portion of the lower terminal 120, at the stage of FIG. 2A. In this case, the via 320 may be formed to fill the via hole 136, during the reflow process of FIG. 6A.

Figure 7E:
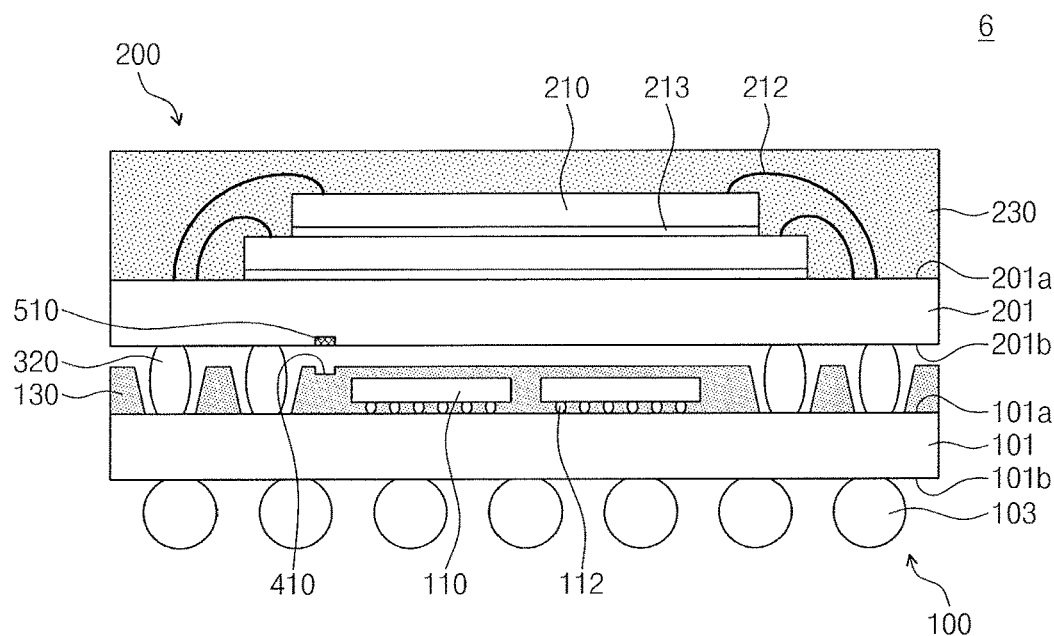

Referring to FIG. 7E, a semiconductor package 6 may include a plurality of lower semiconductor chips 110 mounted on the lower package substrate 101. The lower semiconductor chips 110 may be disposed on the top surface 101a of the lower package substrate 101 and may be laterally spaced apart from each other.

Figure 7F:
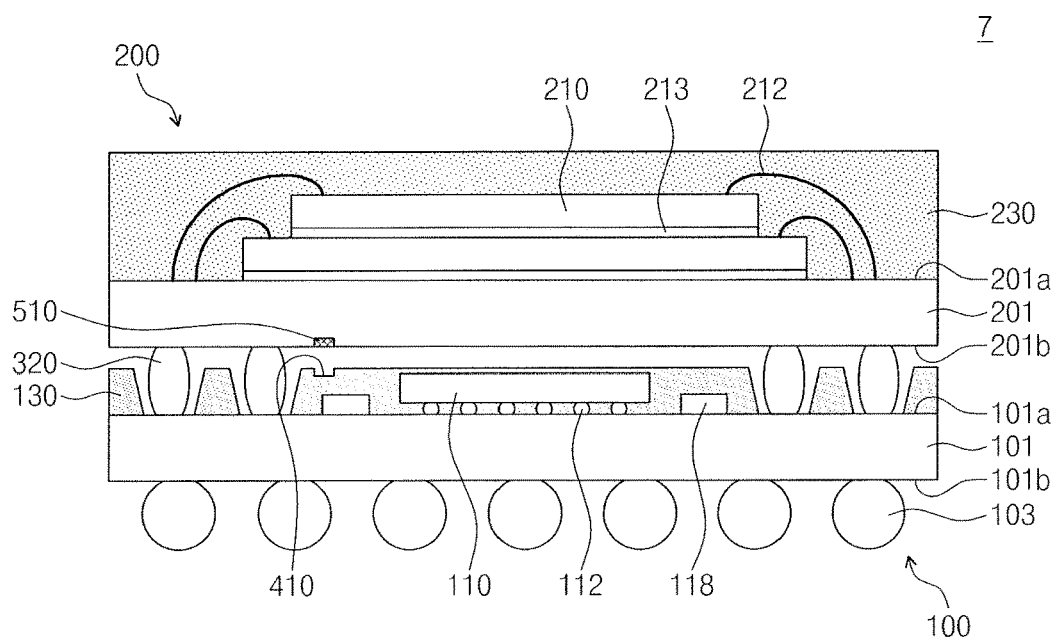

Referring to FIG. 7F, a semiconductor package 7 may further include at least one passive device 118 (e.g., a capacitor or an inductor) mounted on the lower package substrate 101. The passive device 118 may be disposed on the top surface 101a of the lower package substrate 101 and may be laterally spaced apart from the lower semiconductor chip 110.

Figure 7G:
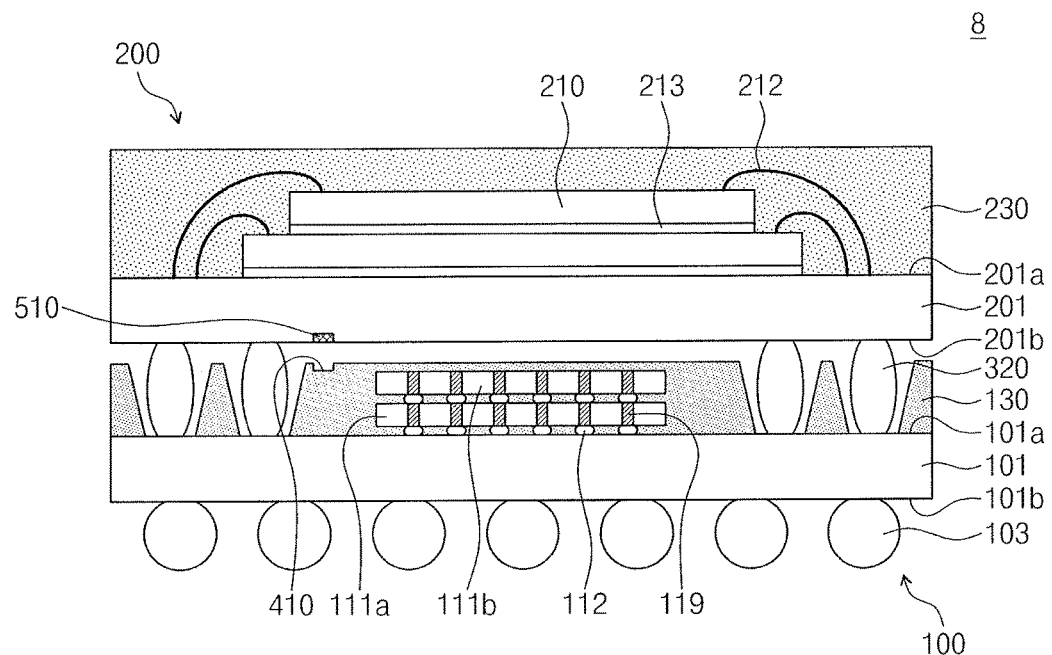

Referring to FIG. 7G, a semiconductor package 8 may include a plurality of lower semiconductor chips (e.g., first and second lower semiconductor chips 111a and 111b) stacked on the lower package substrate 101. The first lower semiconductor chip 111a may include at least one through electrode 119. The second lower semiconductor chip 111b may include or not include the through electrode 119. The lower semiconductor chips 111a and 111b may be electrically connected to each other and to the lower package substrate 101 via the connection terminals 112 that are electrically connected to the through electrodes 119.

Figure 7H:
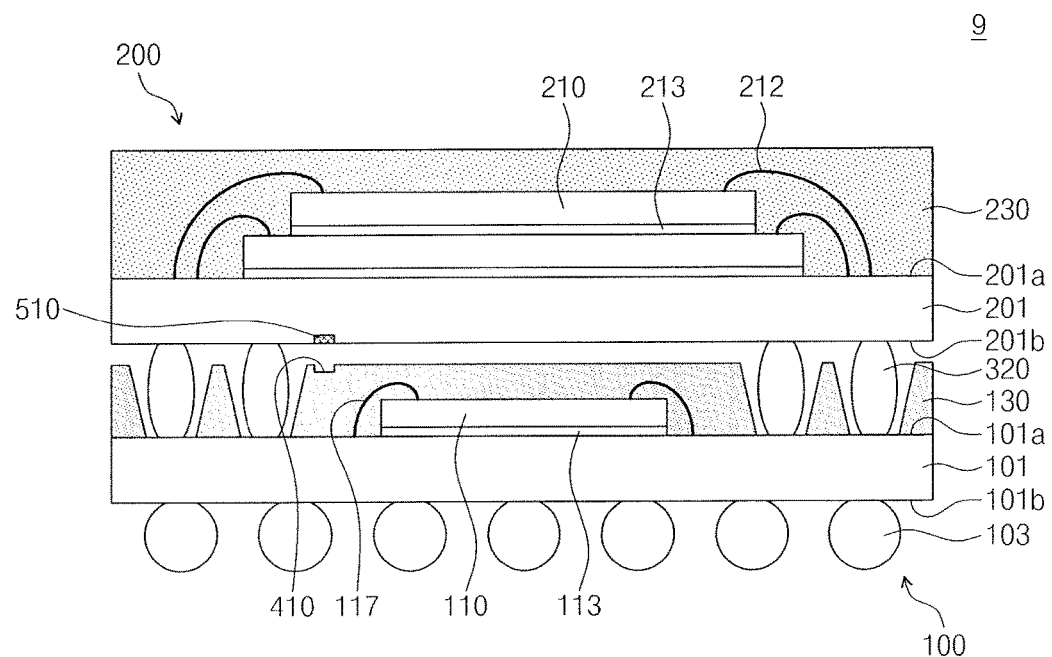

Referring to FIG. 7H, a semiconductor package 9 may include the lower package 100 with a wire bonding structure. The lower package 100 may include a plurality of bonding wires 117 which may be formed to electrically connect the lower package substrate 101 to the lower semiconductor chip 110. The lower semiconductor chip 110 may be attached to the lower package substrate 101 by an insulating adhesive layer 113.

The technical features of the semiconductor packages 2-9 illustrated in FIGS. 7A to 7H may be combined with each other. As an example, the under-fill layer 114 in the semiconductor package 2 of FIG. 7A may be provided in at least one of other semiconductor packages 3-9. As another example, the heat transfer layer 116 in the semiconductor package 3 of FIG. 7B may be provided in at least one of other semiconductor packages 2 and 4-9. Further, the semiconductor packages 2-9 are substantially the same as the semiconductor package 1 described previously with reference to FIGS. 1A-6B, with the exception of the noted differences. Like reference numerals refer to like elements throughout.

By way of summation and review, according to some embodiments, a via-hole forming process and a laser marking process are performed in situ using a same laser, e.g., via a laser drilling process. The laser marking process provides a laser mark with high visibility, while being performed without damage to a semiconductor chip. As such, it is possible to improve a stacking yield in the fabricating method, and it is possible to improve a warpage property of the semiconductor package.

Thus, it is possible to simplify an overall process of fabricating a semiconductor package and thereby to reduce a process time of the fabrication process. The simplification of the semiconductor package fabrication process may allow for a reduction of costs in an equipment investment and in a fabrication process. The use of the laser marking process may make it possible to distinctly form a laser mark, without damage of a semiconductor chip, and to improve a warpage property of a semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   an upper package stacked on a lower package; and
   a via between the lower and upper packages to electrically connect the lower and upper packages to each other,
   wherein the lower package includes:
      a lower package substrate,
      a lower semiconductor chip on the lower package substrate, and
      a lower mold layer encapsulating the lower semiconductor chip, the lower mold layer having an alignment mark on a marking region, the marking region being between the via and the lower semiconductor chip, and
   wherein the upper package includes an upper package substrate, a bottom surface of the upper package substrate including a first recognition mark vertically aligned with the alignment mark.

2. The semiconductor package as claimed in claim 1, wherein:
   the lower semiconductor chip includes a bottom surface facing the lower package substrate, and a top surface opposite to the bottom surface, and
   the lower mold layer covers the top surface of the lower semiconductor chip.

3. The semiconductor package as claimed in claim 1, wherein:
   the lower mold layer includes a via hole spaced apart from a side surface of the lower semiconductor chip, the via being positioned in the via hole, and
   the marking region has a thickness substantially equal to a depth of the via hole.

4. The semiconductor package as claimed in claim 3, wherein the via is spaced apart from an inner side surface of the via hole.

5. The semiconductor package as claimed in claim 4, wherein the inner side surface of the via hole has an increasing horizontal width in a direction directed away from a top surface of the lower package substrate.

6. The semiconductor package as claimed in claim 1, wherein the alignment mark includes at least one of a first mark and a second mark, the first mark to vertically align with the first recognition mark in order to rotationally align the upper package with respect to the lower package, and the second mark to vertically align between centers of the lower and upper packages.

7. The semiconductor package as claimed in claim 6, wherein the second mark includes at least two second recognition marks adjacent to at least two opposite corners of the lower semiconductor chip.

8. The semiconductor package as claimed in claim 6, wherein the first mark is adjacent to at least one corner of the lower semiconductor chip.

9. The semiconductor package as claimed in claim 8, wherein the upper package includes a position vertically aligned with the first mark.

10. A semiconductor package, comprising:
an upper package stacked on a lower package; and
a via between the lower and upper packages to electrically connect the lower and upper packages to each other,
wherein the lower package includes:
  a lower semiconductor chip on a lower package substrate, and
  a lower mold layer encapsulating the lower semiconductor chip, the lower mold layer having an alignment mark between the via and a lateral surface of the lower semiconductor chip, the alignment mark being horizontally spaced apart from each of the via and the lateral surface of the lower semiconductor chip, and
  wherein the upper package includes an upper package substrate, a bottom surface of the upper package substrate including a recognition mark vertically aligned with the alignment mark.

11. The semiconductor package as claimed in claim 10, wherein the lower mold layer covers a top surface of the lower semiconductor chip, a depth of the alignment mark is equal to or larger than a thickness of a portion of the lower mold layer covering the top surface of the lower semiconductor chip.

12. The semiconductor package as claimed in claim 10, wherein the alignment mark faces the upper package, the alignment mark being between the lateral surface of the lower semiconductor chip and an immediately adjacent via.

13. The semiconductor package as claimed in claim 10, wherein the alignment mark is on a portion of the lower mold layer that does not overlap a top of the lower semiconductor chip.

14. The semiconductor package as claimed in claim 10, wherein a thickness of the lower mold layer defining sidewalls of the alignment mark equals a depth of the via.

15. A semiconductor package, comprising:
a lower package including at least one lower semiconductor chip on a lower package substrate, the lower semiconductor chip being encapsulated with a lower mold layer;
an upper package including at least one upper semiconductor chip on an upper package substrate, the upper semiconductor chip being encapsulated with an upper mold layer; and
a via electrically connecting the lower package to the upper package,
wherein the lower mold layer includes a marking region between the via and the lower semiconductor chip, and
wherein the marking region includes:
  a rotational alignment mark to allow the lower and upper packages to have the same orientation, and
  a vertical alignment mark to align centers of the lower and upper packages,
wherein the upper package substrate includes a top surface, on which the at least one upper semiconductor chip is mounted, and a bottom surface opposite to the top surface, and
wherein the bottom surface of the upper package substrate includes a first recognition mark vertically aligned with the rotational alignment mark.

16. The semiconductor package as claimed in claim 15, wherein:
the lower semiconductor chip includes a bottom surface facing the lower package substrate and a top surface opposite to the bottom surface, and
the lower mold layer includes a top surface at a higher level than that of the lower semiconductor chip.

17. The semiconductor package as claimed in claim 15, wherein:
the lower semiconductor chip includes a bottom surface facing the lower package substrate and a top surface opposite to the bottom surface, and
the lower mold layer includes a top surface coplanar with that of the lower semiconductor chip.

18. The semiconductor package as claimed in claim 15, wherein:
the rotational alignment mark is adjacent to one of corners of the lower semiconductor chip, and
the vertical alignment mark includes at least two second recognition marks adjacent to at least two opposite ones of the corners of the lower semiconductor chip.

19. The semiconductor package as claimed in claim 15, wherein the marking region is a part of the lower mold layer enclosing a side surface of the lower semiconductor chip.

* * * * *